US010578861B2

(12) United States Patent
Galinski, III et al.

(10) Patent No.: US 10,578,861 B2
(45) Date of Patent: Mar. 3, 2020

(54) PIEZOELECTRIC MIRROR SYSTEM

(71) Applicant: Microsoft Technology Licensing, LLC, Redmond, WA (US)

(72) Inventors: Martin Francis Galinski, III, Santa Clara, CA (US); Wei Shen, Palo Alto, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 254 days.

(21) Appl. No.: 15/793,819

(22) Filed: Oct. 25, 2017

(65) Prior Publication Data

US 2019/0121121 A1  Apr. 25, 2019

(51) Int. Cl.
*G02B 26/08* (2006.01)
*B81B 3/00* (2006.01)
(Continued)

(52) U.S. Cl.
CPC ........ *G02B 26/0833* (2013.01); *B81B 3/0021* (2013.01); *B81B 3/0083* (2013.01); *G02B 26/0825* (2013.01); *G02B 26/0858* (2013.01); *H01L 41/042* (2013.01); *H01L 41/0933* (2013.01); *H02N 2/0075* (2013.01); *H02N 2/10* (2013.01); *B81B 2201/042* (2013.01)

(58) Field of Classification Search
CPC ............ G02B 26/0833; G02B 26/0825; G02B 26/0858; B81B 3/0083; B81B 3/0021; B81B 2201/042; H01L 41/042; H01L 41/0933; H02N 2/0075; H02N 2/10
USPC ...................................................... 359/213.1
See application file for complete search history.

(56) References Cited

U.S. PATENT DOCUMENTS

2003/0230997 A1  12/2003 Hagen
2004/0256921 A1  12/2004 Turner et al.
(Continued)

FOREIGN PATENT DOCUMENTS

EP  2654193 A2  10/2013

OTHER PUBLICATIONS

Rombach, et al., "Low Power Closed-loop Driving Circuit for Piezoelectric Microscanners Based on Tuneable Capacitive Position Sensors", In Journal of Procedia Engineering, vol. 120, 2015, pp. 63-66.

(Continued)

*Primary Examiner* — Euncha P Cherry
(74) *Attorney, Agent, or Firm* — Workman Nydegger (57) ABSTRACT

A piezo MEMS mirror system that includes a drive system that drives a piezo MEMS mirror that generates an image on a portable device display. The drive system includes a DC-AC converter that operates to convert the DC power provided by the battery to AC power. The DC-AC converter may generate the AC power having a peak voltage that is at an intermediate level—being between the DC voltage of the battery, and the peak AC voltage generated by the drive system. The drive system also includes an output filter that uses a series-coupled inductance system (perhaps inductively coupled inductors in a differential mode circuit) in conjunction with a capacitance of the piezo MEMS mirror (and perhaps tuning capacitors to account for mirror fabrication deviations) to amplify the AC voltage of the AC power at a mechanical resonant frequency of the piezo MEMS mirror.

17 Claims, 6 Drawing Sheets

(51) Int. Cl.
*H01L 41/09* (2006.01)
*H01L 41/04* (2006.01)
*H02N 2/00* (2006.01)
*H02N 2/10* (2006.01)

(56) References Cited

U.S. PATENT DOCUMENTS

| | | |
|---|---|---|
| 2005/0134320 A1 | 6/2005 | Roessig et al. |
| 2005/0280879 A1 | 12/2005 | Gibson et al. |
| 2006/0291063 A1 | 12/2006 | Takemoto |
| 2008/0285103 A1* | 11/2008 | Mizumoto ......... G02B 26/0858 359/199.1 |
| 2015/0062683 A1 | 3/2015 | Akanuma et al. |
| 2015/0219875 A1 | 8/2015 | Bansal et al. |
| 2018/0070436 A1* | 3/2018 | Feichtinger ........... H01L 25/167 |

OTHER PUBLICATIONS

"International Search Report and Written Opinion Issued in PCT Application No. PCT/US2018/055765", dated Jan. 23, 2019, 11 pages.

\* cited by examiner

PIEZOELECTRIC MIRROR SYSTEM

BACKGROUND

Computing systems and associated networks have greatly revolutionized our world. Even battery powered portable devices now have significant computing power. Many types of portable devices have proliferated into the marketplace. Portable devices have a small display, which often include micro-electromechanical systems (MEMS). MEMS-based micro display technologies are attractive to portable display devices, due to their ability to generate high image quality, at a relative small size and low weight.

In some cases, the image on the display is created in part by piezoelectric MEMS mirrors (also termed a "piezo MEMS mirror" or simply "MEMS mirror") which provide horizontal and vertical scanning. Piezo MEMS mirrors require alternating current (AC) driving voltage and current. The driving voltages are very high often in the order of 30 to 100 volts. Compare this to a typical portable device battery (often a Li-ion battery) which provides a direct current (DC) voltage typically less than 4.5V. The MEMS mirror typically has a mechanical resonant frequency on the order of tens of kilohertz (kHz). In the addition to the real power component that mirrors need to overcome friction, up to 10 VA imaginary power component could be needed to agitate the Piezo actuators. The AC driving voltage includes a frequency component that is at this mechanical resonant frequency so as to properly operate the piezo MEMS mirror. A drive systems operates to use the smaller DC voltage provided by the battery to provide an appropriate higher voltage AC driving voltage at the proper current.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

At least some embodiments described herein relate to a piezo MEMS mirror system. Such a mirror system may be used, for instance, to perform scanning when producing an image on a display of a portable device. Portable devices are battery powered where the battery provides DC power at a relative low DC voltage. However, the piezo MEMS mirror is driven by AC power at a much higher peak AC voltage.

The piezo MEMS mirror system includes a drive system that is connected at its input to DC power provided by the battery. The drive system uses that DC power to create AC power at high peak voltage at the output of the drive system, so as to drive the piezo MEMS mirror. The drive system generates properly conditioned AC power based on such low voltage batteries. Such properly condition power appropriately drives the piezo MEMS mirror to allow for high quality image generation. Furthermore, in some embodiments, the drive system is small allowing the portable device to remain lightweight, and wastes less power, thereby lengthening battery life.

The drive system includes a DC-AC converter that operates to convert the DC power provided by the battery to AC power. In one embodiment, the DC-AC converter generates the AC power having a peak voltage that is at an intermediate level—being between the DC voltage of the battery and the peak AC voltage generated by the drive system. For instance, the DC-AC converter could comprise a DC boost circuit that boosts the DC voltage up to approximately that intermediate voltage, followed by an AC voltage converter configured to convert the DC power provided by the DC boost circuit to the intermediate voltage AC power. As an example, the AC voltage converter could generate differential AC power. This could be accomplished by using an H-bridge.

The drive system also includes an output filter that is coupled to receive the AC power provided by the DC-AC converter. The output filter using an inductance system coupled in series between the input of the output filter and the output of the output filter and drive system. The output filter uses the inductance system in conjunction with a capacitance of the piezo MEMS mirror to amplify the AC voltage of the AC power at a mechanical resonant frequency of the piezo MEMS mirror. That conditioned AC power (having high power at the resonant frequency of the piezo MEMS mirror) is provided at the output of the drive system for driving the piezo MEMS mirror.

The output filter could operate differentially, in which case there is an inductor coupled in series between each of the two inputs of the output filter, and each of the two outputs of the output filter. To allow for higher inductances, those two inductors could be inductively coupled. This allows the drive system to be relatively small notwithstanding having such inductors. The presence of such inductors in conjunction with the capacitance of the piezo MEMS mirror also efficiently conditions such AC power so as to reduce lost power.

A tuning capacitor may also be coupled between each of the output nodes of the output filter and a fixed voltage (such as ground). Such may be used to tune the drive circuit to generate a power at a frequency of the mechanical resonant frequency of the actually fabricated piezo MEMS mirror. This is helpful as semiconductor processing technology at small scales can introduce some small variation in the actually fabricated MEMS structure, thereby causing some variation in the actual mechanical resonant frequency of the piezo MEMS mirror.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

At least some embodiments described herein relate to a piezo MEMS mirror system. Such a mirror system may be used, for instance, to perform scanning when producing an image on a display of a portable device. Portable devices are battery powered where the battery provides DC power at a relative low DC voltage. However, the piezo MEMS mirror is driven by AC power at a much higher peak AC voltage.

The piezo MEMS mirror system includes a drive system that is connected at its input to DC power provided by the battery. The drive system uses that DC power to create AC power at high peak voltage at the output of the drive system, so as to drive the piezo MEMS mirror. The drive system generates properly conditioned AC power based on such low voltage batteries. Such properly condition power appropriately drives the piezo MEMS mirror to allow for high quality image generation. Furthermore, in some embodiments, the drive system is small allowing the portable device to remain lightweight, and wastes less power, thereby lengthening battery life.

The drive system includes a DC-AC converter that operates to convert the DC power provided by the battery to AC power. In one embodiment, the DC-AC converter generates the AC power having a peak voltage that is at an intermediate level—being between the DC voltage of the battery, and the peak AC voltage generated by the drive system. For instance, the DC-AC converter could comprise a DC boost circuit that boosts the DC voltage up to approximately that intermediate voltage, followed by an AC voltage converter configured to convert the DC power provided by the DC boost circuit to the intermediate voltage AC power. As an example, the AC voltage converter could generate differential AC power. This could be accomplished by using an H-bridge.

The drive system also includes an output filter that is coupled to receive the AC power provided by the DC-AC converter. The output filter using an inductance system coupled in series between the input of the output filter and the output of the output filter and drive system. The output filter uses the inductance system in conjunction with a capacitance of the piezo MEMS mirror to amplify the AC voltage of the AC power at a mechanical resonant frequency of the piezo MEMS mirror. That conditioned AC power (having high power at the resonant frequency of the piezo MEMS mirror) is provided at the output of the drive system for driving the piezo MEMS mirror.

The output filter could operate differentially, in which case there is an inductor coupled in series between each of the two inputs of the output filter, and each of the two outputs of the output filter. To allow for higher inductances, those two inductors could be inductively coupled. This allows the drive system to be relatively small notwithstanding having such inductors. The presence of such inductors in conjunction with the capacitance of the piezo MEMS mirror also efficiently conditions such AC power so as to reduce lost power.

A tuning capacitor may also be coupled between each of the output nodes of the output filter and a fixed voltage (such as ground). Such may be used to tune the drive circuit to generate a power at a frequency of the mechanical resonant frequency of the actually fabricated piezo MEMS mirror. This is helpful as semiconductor processing technology at small scales can introduce some small variation in the actually fabricated MEMS structure, thereby causing some variation in the actual mechanical resonant frequency of the piezo MEMS mirror.

Figure 1:
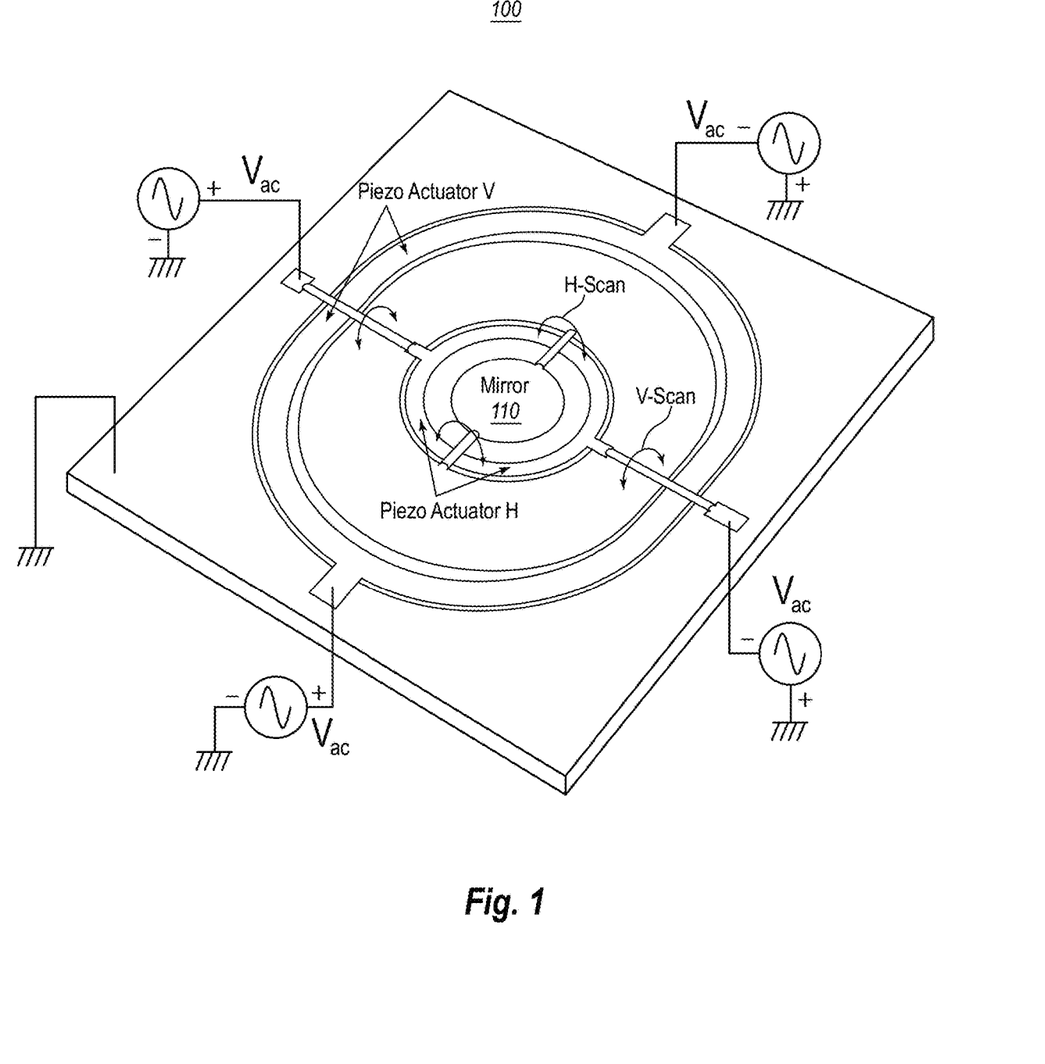
FIG. 1 illustrates a piezo MEMS mirror in which a reflective mirror is centered and supported along two orthogonally pivoting axes, with rotational movement of the mirror around each axis being controlled via AC voltages applied to piezoelectric actuators.

FIG. 1 illustrates a piezo MEMS mirror 100. The principles described herein are not limited to the structure, form, or size of the piezo MEMS mirror. Accordingly, the piezo MEMS mirror 100 is shown by way of example only. In this particular example, the piezo MEMS mirror 100 includes a reflective mirror 110 at its center, which is supported by two orthogonally pivoting axes. The vertical scan and the horizontal scan are controlled via respective piezoelectric actuators. By applying oscillating electrical voltages to the respective piezoelectric actuators, the mirror is caused to oscillate, thereby causing appropriate scanning to occur on a display. This oscillation can be most efficiently obtained and maintained if occurring at a mechanical resonant frequency of the piezo MEMS mirror.

The voltages required to actuate the piezo mirror are quite high and often orders of magnitude higher than the maximum DC voltage that can be provided by a battery of a portable device. In accordance with the principles described herein, a high voltage piezoelectric actuation voltage is attained at the mechanical resonant frequency of the piezo MEMS mirror so as to efficient drive mechanical oscillation of the piezo MEMS mirror.

Figure 2:
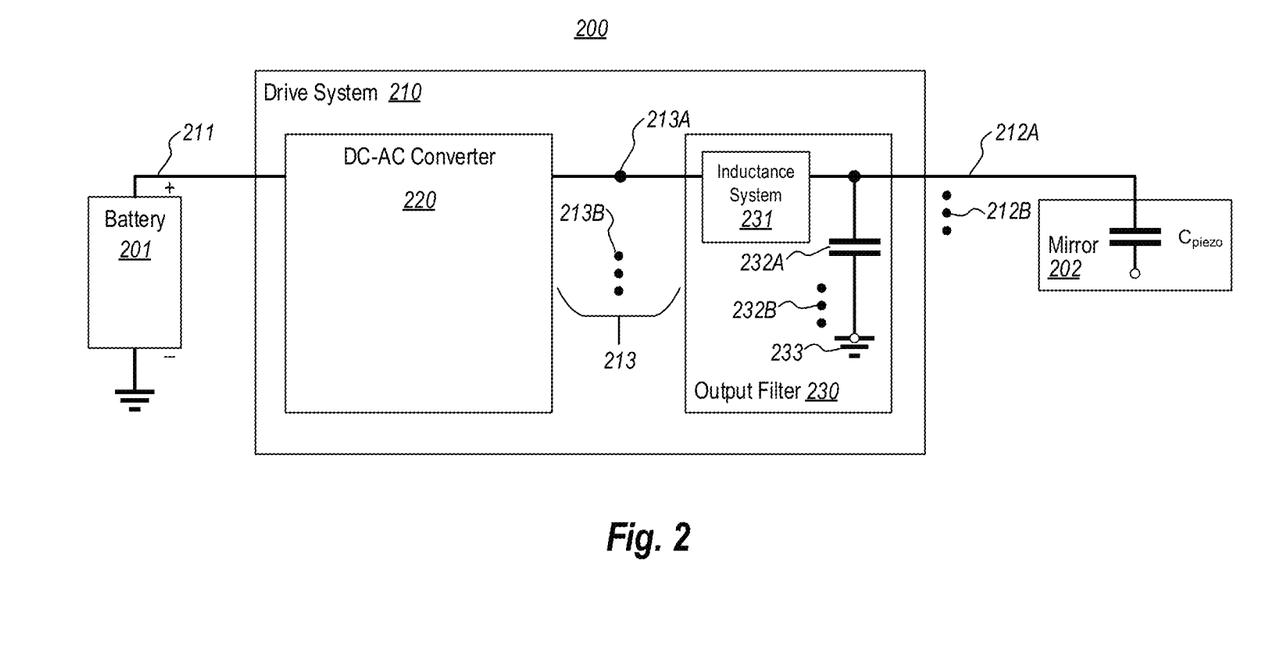
FIG. 2 illustrates a piezo MEMS mirror system in accordance with the principles described herein, which includes a drive system that uses DC power from a battery to drive a piezo MEMS mirror.

FIG. 2 illustrates a piezo MEMS mirror system 200 in accordance with the principles described herein. The piezo MEMS mirror system 200 includes a battery 201 and a piezo MEMS mirror 202. A drive system 210 operates to receive at its input 211 the DC power of the battery 201, and generate at output terminal(s) 212, a high-voltage AC signal for driving the piezo MEMs mirror 202. It is an extremely difficult task to obtain such high gain driving, with a high voltage and high quality output signal at finely controlled frequency, while maintaining power efficiencies, and a small size footprint. But the principles described herein achieves these benefits.

A single output node 212A might be used if the AC output used to drive the piezo MEMS mirror 202 is non-differential mode (i.e., single-ended). Alternatively, two output nodes 212A and at least one other (as represented by the ellipses 212B) might be used if the AC output used to drive the piezo MEMS mirror 202 is differential mode. As an example, the piezo MEMS mirror 202 may be the piezo MEMS mirror 100 of FIG. 1.

Figure 3:
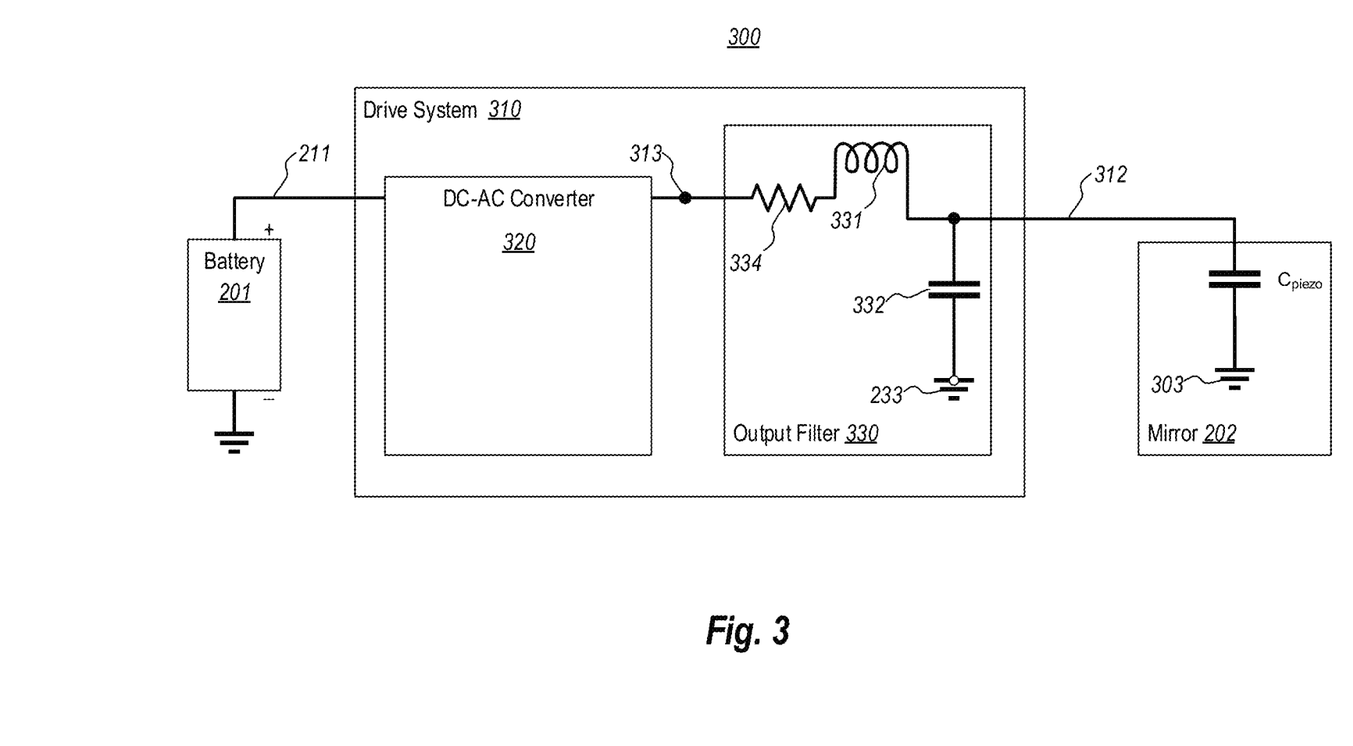
FIG. 3 illustrates a piezo MEMS mirror system operating so as to be single-ended, and represents an example of the piezo MEMS mirror system of FIG. 2.
Figure 4:
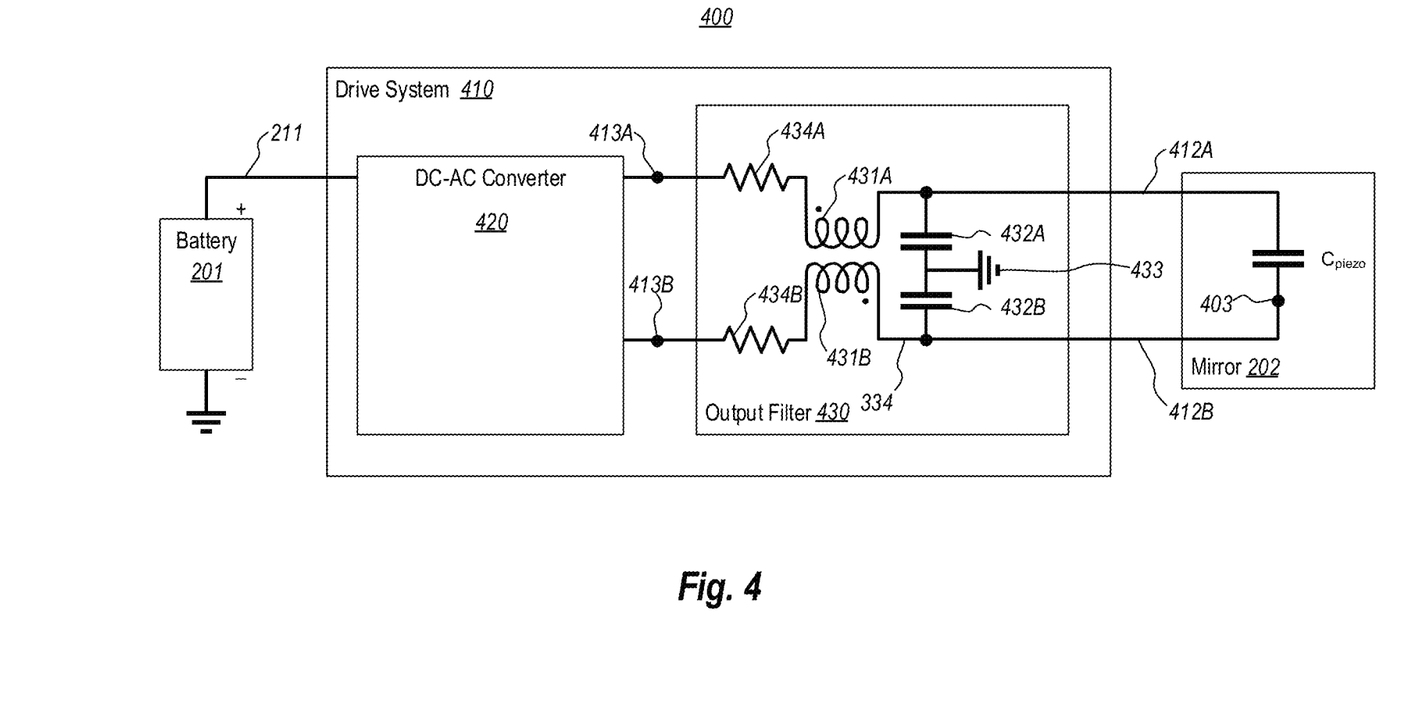
FIG. 4 illustrates a piezo MEMS mirror system operating in differential mode, and represents an example of the piezo MEMS mirror system of FIG. 2.
Figure 5:
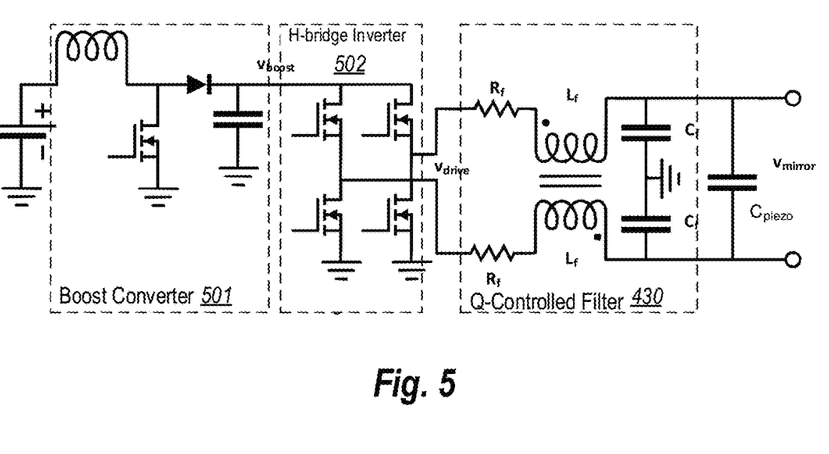
FIG. 5 illustrates an example circuit diagram of a MEMS mirror system that represents an example of the MEMS mirror system of FIG. 4.

The mirror system 200 is represented quite abstractly in FIG. 2. FIG. 3 illustrates a more concrete example of a piezo MEMS mirror system 300 which operates to drive the piezo MEMS mirror 202 in non-differential mode (single-ended) using a single output terminal 312. FIG. 4 illustrates a more concrete example of a piezo MEMS mirror system 400 which operates to drive the piezo MEMS mirror in differential mode using two output terminals 412A and 412B. FIG. 5 illustrates an example circuit diagram of a MEMS mirror system 500 that represents an example of the MEMS mirror system 400 of FIG. 4.

Referring to FIG. 2, a DC-AC converter 220 operates to convert the DC power provided by the battery 201 to AC power. The DC-AC converter 220 receives the DC power provided by the battery 201 on the input terminal 211, and provides AC power at intermediate node(s) 213. In the illustrated embodiment, the intermediate node(s) 213 that carry the AC power includes at least one intermediate node 213A. A single intermediate node might be used if the AC output of the DC-AC converter 220 was single-ended, which could be the case, for instance, if the output of the drive system 210 were also single-ended. However, the ellipses 213B represent that the AC power may be provided by the DC-AC converter 220 using multiple intermediate nodes. Two intermediate nodes might be used if the AC output of the DC-AC converter 220 was differential mode. This could be the case, for instance, if the output of the drive system 210 was differential mode.

The output filter 230 receives the AC voltage from the intermediate node(s) 213. An inductance system 231 is coupled in series between the intermediate node(s) 213 and the output terminal(s) 212. The output filter 230 uses the inductance system 231 in conjunction with a capacitance $C_{mirror}$ of the piezo MEMS mirror 202 to 1) amplify an AC voltage of the AC power provided by the DC-AC converter at a mechanical resonant frequency of the piezo MEMS mirror 202, and 2) provide the AC power at the amplified voltage at the output terminal(s) 212 of the drive system 210 for driving the piezo MEMS mirror 202. In one embodiment, the peak voltage of the amplified voltage (at a mechanical resonant frequency of the piezo MEMS mirror) provided at the output of the drive system 210 is at least ten times the DC voltage provided by the battery 201.

In one embodiment, the DC-AC converter 220 operates to convert the DC power provided by the battery 201 to an intermediate voltage AC power. That intermediate voltage AC power has a peak voltage that is between 1) at the low end, a voltage of the DC power provided by the battery 201 and 2) at a high end, a peak voltage of the amplified AC voltage provided by the output filter 230. In one embodiment, a peak voltage of the amplified voltage provided at the output of the drive system 210 is at least three times a peak voltage of the intermediate voltage AC power at a mechanical resonant frequency of the piezo MEMS mirror 202.

The output filter 230 may also have tuning capacitor(s) 232 coupled between an output of the output filter 230 and a fixed voltage terminal 233, which may be ground. As will be described hereinafter, the tuning capacitor(s) 232 allow for there to be some deviation in the actual capacitance $C_{mirror}$ of the piezo MEMS mirror 202 that often occurs during fabrication of the piezo MEMS mirror 202. The tuning is helpful to be able to obtained amplified AC power at the mechanical resonant frequency of the piezo MEMS mirror 202. This is because slight fabrication deviations in the piezo MEMS mirror 202 can cause the actual mechanical resonant frequency of the mirror to vary from the designed mechanical resonant frequency. Such fabrication deviations are unavoidable when fabricating small devices using semiconductor processing technology. The tuning capacitor (s) 232 includes at least one tuning capacitor 232A, which is the case with each example of FIGS. 3 through 5. However, the ellipses 232B represent that there may be multiple tuning capacitors 232B, which is the case of FIGS. 4 and 5 when the output filter 230 operates in differential mode.

FIG. 3 illustrates a piezo MEMS mirror system 300 operating so as to be single-ended, having but a single output terminal 312. The piezo MEMS mirror system 300 of FIG. 3 is an example of the piezo MEMS mirror system 200 of FIG. 2. In that case, the output terminal 312 of FIG. 3 is an example of the output terminal 212A of FIG. 2. Furthermore, the drive system 310 of FIG. 3 is an example of the drive system 210 of FIG. 2. The DC-AC converter 320 of FIG. 3 is an example of the DC-AC converter 220 of FIG. 2. The intermediate node 313 of FIG. 3 is an example of the intermediate node 213A of FIG. 2. Also, the output filter 330 of FIG. 3 is an example of the output filter 230 of FIG. 2. The lower terminal of the capacitance $C_{mirror}$ of the piezo MEMS mirror 202 is shown as grounded.

The DC-AC converter 320 operates to convert the DC power provided by the battery 201 to singled-ended AC power applied to the intermediate node 313. The output filter 330 receives the AC voltage from the intermediate node 313. An inductor 331 of FIG. 3 acts as an example of the inductance system 231 of FIG. 2. The inductor 331 is coupled in series between the intermediate node 313 and the output terminal 312. A resistor 334 (possibly modelling parasitic resistance) is additionally represented in series between the intermediate node 313 and the output terminal 312. The output filter 330 also has a tuning capacitor 332 coupled between an output terminal 312 of the output filter 330 and the fixed voltage terminal 233, which may be ground.

Again, the output filter 330 uses the inductor 331 in conjunction with a capacitance $C_{mirror}$ of the piezo MEMS mirror 202 to 1) amplify an AC voltage of the AC power provided by the DC-AC converter at a mechanical resonant frequency of the piezo MEMS mirror 202, and 2) provide the AC power at the amplified voltage at the output terminal(s) 212 of the drive system for driving the piezo MEMS mirror 202. More about how this may be done is described with respect to the differential mode embodiment of FIG. 4.

FIG. 4 illustrates a piezo MEMS mirror system 400 operating so as to be in differential mode, having two output terminals 412A and 412B. The piezo MEMS mirror system 400 of FIG. 4 is an example of the piezo MEMS mirror system 200 of FIG. 2. In that case, the output terminal 412A and 412B of FIG. 4 are example of the output terminal 212A (and another output terminal as represented by the ellipses 212B) of FIG. 2. Furthermore, the drive system 410 of FIG. 4 is an example of the drive system 210 of FIG. 2. The DC-AC converter 420 of FIG. 4 is an example of the DC-AC converter 220 of FIG. 2. The intermediate nodes 413A and 413B of FIG. 4 are examples of the intermediate node 213A (and another intermediate node as represented by the ellipses 213B) of FIG. 2. Also, the output filter 430 of FIG. 3 is an example of the output filter 230 of FIG. 2. The output voltage across terminals 412A and 412B is applied to the capacitance $C_{mirror}$ of the piezo MEMS mirror 202.

The DC-AC converter 420 operates to convert the DC power provided by the battery 201 to differential mode AC power applied across the intermediate nodes 413A and 413B. The output filter 430 receives the differential mode AC voltage from the intermediate nodes 413A and 413B. Two inductors 431A and 431B of FIG. 4 act as an example of the inductance system 231 of FIG. 2. The inductor 431A is coupled in series between the intermediate node 413A and the output terminal 412A. The inductor 431B is coupled in series between the intermediate node 413B and the output terminal 412B. A resistor 434A (perhaps a parasitic resistor) is additionally represented in series between the intermediate node 413A and the output terminal 412A. Likewise, a resistor 434B (perhaps a parasitic resistor) is additionally represented in series between the intermediate node 413B and the output terminal 412B. The output filter 430 also has a tuning capacitor 432A coupled between the output terminal 412A and the fixed voltage terminal 233. The output filter 430 has a tuning capacitor 432B coupled between the output terminal 412A and the fixed voltage terminal 233.

Again, the output filter 430 uses the inductors 431A and 431B in conjunction with a capacitance $C_{mirror}$ of the piezo MEMS mirror 202 to 1) amplify a differential AC voltage of the AC power provided by the DC-AC converter 420 at a mechanical resonant frequency of the piezo MEMS mirror 202, and 2) provide the differential AC power at the amplified voltage at the output terminal(s) 412A and 412B of the drive system 410 for driving the piezo MEMS mirror 202.

In one embodiment, the output filter 430 is balanced in that the inductances of the inductors 431A and 431B are approximately the same. Likewise, the capacitors 432A and 432B may have approximately the same capacitances. The resistors 434A and 434B may likewise have approximately the same resistances, although the resistors 434A and 434B may be parasitic in nature thereby being used to model inherent resistances in the wiring of the inductors and so forth.

In the illustrated embodiment, the inductors 431A and 431B are inductively coupled. This allows for the total size of the inductors to be smaller while providing an inductance system of a suitable level of total inductance. For maximum benefit, the inductors 431A and 431B may be inductively coupled such that a mutual inductance of the inductors 431A and 431B is approximately equal to a self-inductance of each of the inductors 431A and 431B. The ability to inductively couple inductors in the differential mode drive system 410 makes the embodiment of FIG. 4 particularly advantageous.

As previously mentioned, the output filters 230, 330 and 430 are used to amplify the AC power at a frequency that is close to the mechanical resonant frequency of the mechanical mirror. This is of great benefit because the piezo MEMS mirror requires a high voltage AC signal to cause the piezo MEMS mirror 202 to move. Since the AC power is particularly amplified at the mechanical resonant frequency of the piezo MEMS mirror 202, the mechanical resonance of the piezo MEMS mirror 202 may be used to cause the piezo MEMS mirror 202 to properly oscillate. Furthermore, this may be done without wasting too much power amplifying the AC power at frequencies other than that mechanical resonant frequency. Thus, mirror oscillation is properly achieved for scanning, while reducing the amount of power required to perform the oscillation.

Operation of the output filter 430 will now be described. In describing the operation, the inductor 431A and 431B are assumed to be the same inductances, which is represented herein as $L_f$. The tuning capacitors 432A and 432B are assumed to have the same capacitances and is represented herein as $C_f$. The resistors 434A and 434B are assumed to have the same resistance, which is represented herein as $R_f$. As a reminder, the capacitance of the piezo mirror itself is represented herein as $C_{mirror}$.

To properly design the AC driving system, we can model the mirror itself as another series-resonant RLC equivalent circuit with very high Q. Since the effect of the mirror load to the output filter 430 is minimal at any frequency not at mirror resonance, we can characterize the filter 430 mainly by $R_f$, $L_f$, and $C_{piezo}/C_f$. The AC output voltage across output terminals 412A and 412B resonates at a frequency $f_o$ and with total capacitance $(C_f+2C_{piezo})$, which is to be at the mechanical resonant frequency of the piezo MEMS mirror 202. The AC output frequency $f_o$ is represented as follows:

$$f_0 = \frac{1}{2\pi\sqrt{L_f(C_f + 2C_{piezo})}}$$

When running at the series resonant frequency, the resistor $R_f$ is the major factor that limits the current. Here, $I_{drive}$ and $V_{drive}$ represent the AC current and voltage, respectively, across intermediate nodes 413A and 413B. The current $I_{drive}$ is represented by the following formula.

$$I_{drive} = \frac{2V_{drive}}{\pi R_f}$$

Another constrain is the Q factor, which represents the quality of the produced signal across the output terminals 412A and 413, and is represented by the following: The actual Q expression is more complicated, due to the mirror loading effect. However, the mirror effect will only show up around a narrow frequency range near the mechanical resonance.

$$Q = \frac{1}{R_f}\sqrt{\frac{L_f}{C_f + 2C_{piezo}}}$$

The voltage gain of the output filter 430 (represented by the expression $$\left|\frac{V_{mirror}}{V_{drive}}\right|$$

of the mirror voltage (represented by $V_{mirror}$) over frequency f is represented by the following:

$$\left|\frac{V_{mirror}}{V_{drive}}\right| = \frac{4}{\pi}\left|\frac{Z_{mirror}(\omega)}{Z_{mirror}(\omega) + (2R_f + j\omega \cdot 4L_f) \cdot} \right.$$
$$\left. [1 + j\omega \cdot (C_f + 2C_{piezo}) \cdot Z_{mirror}(\omega)]\right|$$

As apparent from the above equation, given the parasitic resistances $R_f$ and the mirror capacitance $C_{piezo}$ and with the output of the output filter 430 resonating at capacitance $(C_f+2C_{piezo})$ (after appropriate adjustment with the tuning capacitor $C_f$), it is possible to select the size of the inductance $L_f$ to obtain an appropriate frequency response in which gain is maximized at the mechanical resonant frequency of the piezo MEMS mirror 202. To realize the inductance $L_f$, and minimize the physical size of the inductors 431A and 431B, the inductors 431A and 431B may be coupled as illustrated. When the two windings of the couple inductors are connected in the way shown in FIG. 4, the mutual inductance would add up to the self-inductance.

FIG. 5 illustrates a specific circuit diagram of a piezo MEMS mirror system 500, and represent an example of the piezo MEMS mirror system 400 of FIG. 4. Here, the details of an example DC-AC converter are represented by the combination of a boost converter 501 and an H-bridge converter 502. Boost converters are well known in the art, and thus the details of the boost converter 501 are not described in detail here. The boost converter 501 boosts the DC voltage of the battery from the area of 3 to 4 volts to the area of 15 to 20 volts. The DC output of the boost converter 501 is represented as $V_{boost}$.

The H-Bridge converter 502 also has an operation that is well known in the art, and is designed to provide an output AC signal (of an appropriate square wave), that oscillates between positive and negative $V_{boost}$. It does so at the mechanical resonant frequency of the piezo MEMS mirror 202. The Q controlled filter 430 of FIG. 5 is the same design as that described and illustrated with respect to the output filter 430 of FIG. 4.

Considering the Boost voltage gain $$\left| \frac{V_{boost}}{V_{battery}} \right|,$$

we can design and optimize between the size of the inductor (changing inductance $L_f$) and total power consumption. The most important design criteria is to minimize the total capacitance, so it is recommended that only the necessary tuning capacitance of $C_f$ is added on top of $C_{mirror}$, in such way that it will help absolve the parameter variance of the practical mirrors. With the minimum necessary capacitance determined, the value of $L_f$ and $R_f$ can be found, which will give us needed resonant frequency, voltage gain and power losses.

One acceptable value of the tuning capacitance $C_f$ is 1 nanofarad (1 nF) given a mirror capacitance of 6 nF. However, the appropriate value will dependent on the precision and consistency of the fabrication technology employed to make the piezo MEMS mirror, and the desired yield and reliability for the piezo MEMS mirror or corresponding piezo MEMS mirror system. One acceptable selection of an inductor value $L_f$ is 2 millihenries (2 mH) given a mechanical resonant frequency of the mirror at 25 kilohertz (25 kHz), and with resistance $R_f$ of 200Ω.

Figure 6:
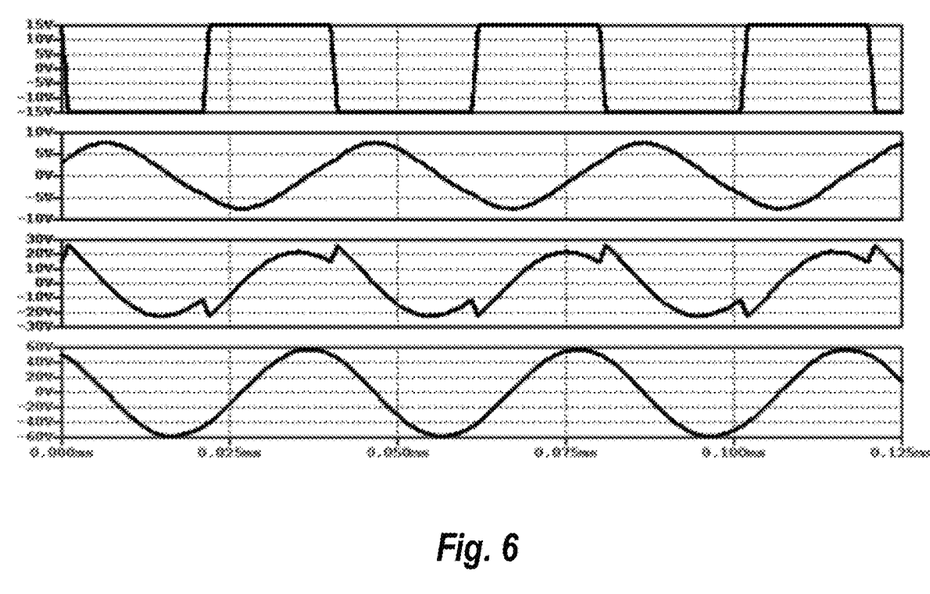
FIG. 6 illustrates a stacked circuit diagram of four timewise aligned waveforms of the Q controlled filter of FIG. 5.

With these values, and with the design illustrated in FIG. 5, the waveforms of FIG. 6 may be obtained. In FIG. 6, the horizontal axis represented time. The vertical axis represents the time-wise voltage of the signal. Four voltage signals are stacked (each centered vertically at zero volts) so that one can see the time-wise relationship between the four signals.

The uppermost signal represents the signal input to the Q controlled filter 430. It is a substantially square wave, with a positive and negative value at approximately the DC voltage provided by $V_{boost}$. In this case, $V_{boost}$ is 15 volts, which is about 4 or 5 times the DC voltage output of the battery. So the AC voltage that is input to the Q controlled filter 430 is already amplified to an intermediate value between the voltage of the battery, and the resonant voltage provided to the piezo MEMS mirror. The second signal from the top represents the voltage across the resistors having the resistance $R_f$. The third signal from the top (second signal from the bottom) represents the voltage across the inductor having inductance $L_f$.

Figure 7:
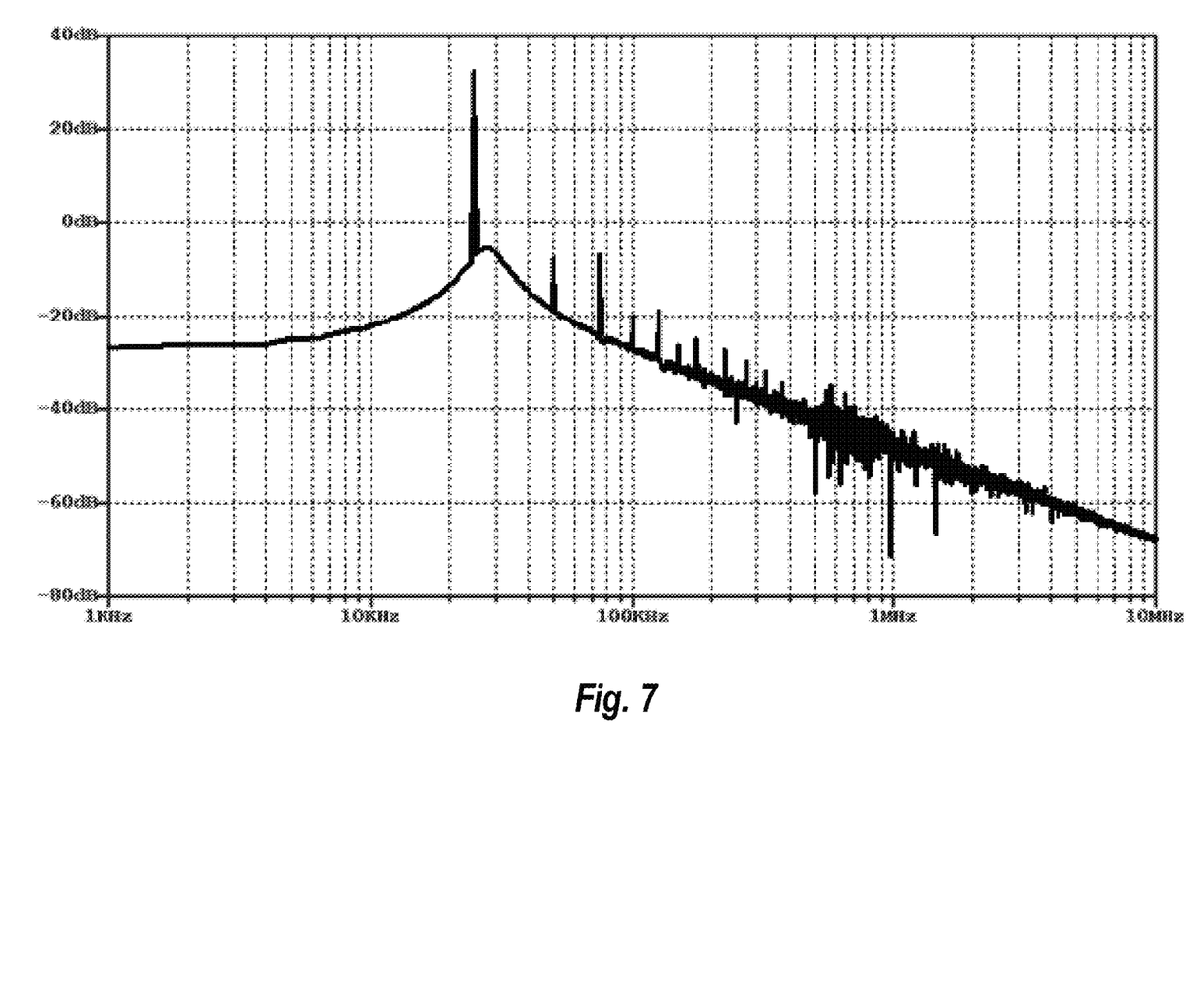
FIG. 7 illustrates the frequency response of the voltage applied to the piezo MEMS mirror given described parameter values of the circuit of FIG. 5, and which shows an amplitude spike at the mechanical resonant frequency of the piezo MEMS mirror.

The bottom signal shows the voltage across the output terminals as applied to the piezo MEMS mirror. Note that the signal is now oscillating with an almost exact sinusoidal wave at the mechanical resonant frequency of the mirror (in this case 25 kHz, which converts to a wavelength period of 40 microseconds). Furthermore, the amplitude of the signal varies between plus and minus 60 volts for a total voltage swing of 120 volts. FIG. 7 illustrates the frequency response of the voltage applied to the mirror. Note the sharp peak at the mechanical resonant frequency of the mirror (in this case 25 kHz), which steadily decline higher than that value, and negligible value below that value.

Thus, truly an appropriate very high voltage for driving a piezo MEMS mirror has been obtained. Furthermore, by amplifying primarily at the mechanical resonant frequency of the mirror, energy is preserved by avoiding heavy amplification at other frequencies that might not benefit, or may even interfere with, the resonating of the piezo MEMS mirror. Also, because of the coupled inductors, the inductors may be made much smaller. With power preservation, lightness of weight, and the ability to generate high voltage AC signals, the principles described herein are well suited to drive piezo MEMS mirror systems that are incorporated into mobile devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A piezo MEMS mirror system comprising:
   a drive system that is configured to be connected at its input to DC power provided by a battery, and configured to be connected at its output to a piezo MEMS mirror, the drive system comprising:
   a DC-AC converter that operates to convert the DC power provided by the battery to AC power; and
   an output filter that has at least two input nodes and at least two output nodes and is coupled to receive, at the at least two input nodes of the output filter, AC power provided by the DC-AC converter in differential form across the two input nodes,
   the output filter comprising an inductance system coupled in series between the at least one input of the output filter and at least one output of the output filter, and
   the output filter configured to use the inductance system in conjunction with a capacitance of the piezo MEMS mirror to amplify an AC voltage of the AC power provided by the DC-AC converter at a mechanical resonant frequency of the piezo MEMS mirror, and provide the AC power at the amplified voltage in differential form across the at least two output nodes of the drive system for driving the piezo MEMS mirror.

2. The piezo MEMS mirror system in accordance with claim 1, the inductance system of the output filter comprising:
   a first inductor coupled in series between a first input node of the two inputs nodes of the output filter and a first output node of the two output nodes of the output filter; and
   a second inductor coupled in series between a second input node of the two inputs nodes of the output filter and a second output node of the two output nodes of the output filter.

3. The piezo MEMS mirror system in accordance with claim 2, the output filter further comprising:

a first tuning capacitor coupled between the first output node of the output filter and a fixed voltage terminal; and
a second tuning capacitor coupled between the second output node of the output filter and a fixed voltage terminal.

4. The piezo MEMS mirror system in accordance with claim 2, the inductance of the first inductor being approximately the same as the inductance of the second inductor.

5. The piezo MEMS mirror system in accordance with claim 4, the first inductor and the second inductor being inductively coupled.

6. The piezo MEMS mirror system in accordance with claim 5, the first inductor and the second inductor being inductively coupled such that a mutual inductance of the coupled first and second inductors is approximately equal to a self-inductance of each of the first and second inductors.

7. The piezo MEMS mirror system in accordance with claim 1, the output filter further comprising:
a first tuning capacitor coupled between a first output node of the two outputs of the output filter and a fixed voltage terminal; and
a second tuning capacitor coupled between a second output node of the two outputs of the output filter and a fixed voltage terminal.

8. The piezo MEMS mirror system in accordance with claim 7, the capacitance of the first tuning capacitor being approximately the same as the capacitance of the second tuning capacitor.

9. The piezo MEMS mirror system in accordance with claim 1, the output filter further comprising:
a tuning capacitor coupled between an output of the output filter and a fixed voltage terminal.

10. The piezo MEMS mirror system in accordance with claim 1, further comprising:
the piezo MEMS mirror.

11. The piezo MEMS mirror system in accordance with claim 1, further comprising:
the battery.

12. The piezo MEMS mirror system in accordance with claim 1, the DC-AC converter operating to convert the DC power provided by the battery to an intermediate voltage AC power, the intermediate voltage AC power have a peak voltage that is between 1) a voltage of the DC power provided by the battery and 2) a peak voltage of the amplified AC voltage provided by the output filter.

13. The piezo MEMS mirror system in accordance with claim 12, the DC-AC converter comprising:
a DC boost circuit configured to boost a DC voltage provided by the battery to DC power having approximately the intermediate voltage; and
an AC voltage converter configured to convert the DC power provided by the DC boost circuit to the intermediate voltage AC power.

14. The piezo-mirror system in accordance with claim 13, a peak voltage of the amplified voltage provided at the output of the drive system being at least three times a peak voltage of the intermediate voltage AC power at a mechanical resonant frequency of the piezo MEMS mirror.

15. The piezo-mirror system in accordance with claim 1, a peak voltage of the amplified voltage, at a mechanical resonant frequency of the piezo MEMS mirror, provided at the output of the drive system being at least ten times the DC voltage provided by the battery.

16. A piezo MEMS mirror system comprising:
a piezo MEMS mirror;
a battery; and
a drive system that is connected at its input to DC power provided by the battery, and is connected at its output to the piezo MEMS mirror, the drive system comprising:
a DC-AC converter that operates to convert the DC power provided by the battery to an intermediate voltage AC power, the intermediate voltage AC power having a peak voltage that is between 1) a voltage of the DC power provided by the battery and 2) a peak voltage of an amplified AC voltage provided by an output filter, the DC-AC converter comprising:
a DC boost circuit configured to boost the DC voltage provided by the battery to DC power having approximately the intermediate voltage; and
an AC voltage converter configured to convert the DC power provided by the DC boost circuit to the intermediate voltage AC power; and
the output filter that is coupled to receive, at least one input of the output filter, the intermediate voltage AC power provided by the DC-AC converter,
the output filter comprising an inductance system coupled in series between the at least one input of the output filter and at least one output of the output filter, and
the output filter configured to use the inductance system in conjunction with a capacitance of the piezo MEMS mirror to amplify the intermediate voltage AC power provided by the DC-AC converter at a mechanical resonant frequency of the piezo mirror, and provide the amplified AC voltage at the output of the drive system for driving the piezo MEMS mirror.

17. A piezo MEMS mirror system comprising:
a piezo MEMS mirror; and
a drive system that is configured to be connected at its input to DC power provided by a battery, and is differentially connected at two differential output nodes to the piezo MEMS mirror, the drive system comprising:
a DC-AC converter that operates to convert the DC power provided by the battery to differential AC power; and
an output filter that is coupled to receive, across two differential input nodes of the output filter, the differential AC power provided by the DC-AC converter, and provide amplified-voltage differential AC power across the two differential output nodes of the drive system,
the output filter comprising an inductance system coupled in series between the differential input nodes of the output filter and the differential output nodes of the drive system of the output filter, and
the output filter configured to use the inductance system in conjunction with a capacitance of the piezo MEMS mirror to amplify an AC voltage of the AC power provided by the DC-AC converter at a mechanical resonant frequency of the piezo MEMS mirror, and provide the AC power at the amplified voltage, at a mechanical resonant frequency of the piezo MEMS mirror, at the output of the drive system for driving the piezo MEMS mirror.

* * * * *